United States Patent
Pang et al.

(10) Patent No.: US 9,008,153 B2
(45) Date of Patent: Apr. 14, 2015

(54) MICROWAVE PREDISTORTED SIGNAL GENERATING METHOD AND APPARATUS

(71) Applicant: Huawei Technologies Co., Ltd., Shenzhen (CN)

(72) Inventors: Yanzhao Pang, Chengdu (CN); Huaping Shi, Moscow (RU); Song Chen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/280,136

(22) Filed: May 16, 2014

(65) Prior Publication Data
US 2014/0247906 A1 Sep. 4, 2014

Related U.S. Application Data

(63) Continuation of application No. PCT/CN2011/082282, filed on Nov. 16, 2011.

(51) Int. Cl.
*H04B 1/00* (2006.01)
*H04B 1/62* (2006.01)
(Continued)

(52) U.S. Cl.
CPC ............... *H04B 1/62* (2013.01); *H04B 10/58* (2013.01); *H04B 7/086* (2013.01); *H03F 1/3247* (2013.01);
(Continued)

(58) Field of Classification Search
CPC ........ H04B 1/62; H04B 14/064; H04B 10/58; H04B 7/086
USPC ........................................... 375/145; 329/304
See application file for complete search history.

(56) References Cited

U.S. PATENT DOCUMENTS 3,855,539 A * 12/1974 Croisier ......................... 329/304
4,038,536 A * 7/1977 Feintuch ....................... 708/322
(Continued)

FOREIGN PATENT DOCUMENTS

CN 101175061 A 5/2008
CN 102143107 A 8/2011
(Continued)

OTHER PUBLICATIONS

Ye, et al., "Generalized Hammerstein-based Dynamic Nonlinear Behavior Models for Wideband RF Transmitters," Wireless Communications, Networking and Mobile Computing, Sep. 21, 2007, 4 pages.

*Primary Examiner* — Chieh M Fan
*Assistant Examiner* — Sarah Hassan
(74) *Attorney, Agent, or Firm* — Slater & Matsil, L.L.P.

(57) ABSTRACT

Embodiments of the present invention disclose a microwave predistorted signal generating method and apparatus. A microwave receiver receives a first received signal that has undergone analog-to-digital conversion; performs channel compensation on the first received signal, to obtain a second received signal; estimates a first transmitted signal according to the second received signal, where the first transmitted signal is a transmitted signal of a microwave transmitter before digital-to-analog conversion; performs predistortion coefficient computation according to the second received signal and the first transmitted signal; performs, by using a first-order coefficient obtained through the predistortion coefficient computation, linear distortion compensation on the second received signal that is before the first transmitted signal is estimated; and sends other predistortion coefficients except for the first-order coefficient to the microwave transmitter, so that the microwave transmitter performs non-linearity predistortion on a transmitted signal.

12 Claims, 2 Drawing Sheets

(51) Int. Cl.
*H04B 10/58* (2013.01)
*H04B 7/08* (2006.01)
*H03F 1/32* (2006.01)
*H04B 1/04* (2006.01)
*H04L 27/36* (2006.01)

(52) U.S. Cl.
CPC ............ *H04L 27/368* (2013.01); *H03F 1/3258* (2013.01); *H03F 2201/3215* (2013.01); *H04B 1/0475* (2013.01); *H04B 2001/0408* (2013.01); *H04B 2001/0425* (2013.01)

(56) References Cited

U.S. PATENT DOCUMENTS

| | | | |
|---|---|---|---|
| 4,039,748 A * | 8/1977 | Caron et al. | 375/355 |
| 4,763,103 A * | 8/1988 | Galula et al. | 375/145 |
| 6,069,917 A * | 5/2000 | Werner et al. | 375/233 |
| 2001/0055331 A1 * | 12/2001 | Agazzi et al. | 375/216 |
| 2002/0021767 A1 * | 2/2002 | Greiss et al. | 375/316 |
| 2004/0066761 A1 * | 4/2004 | Giannakis et al. | 370/329 |
| 2005/0060142 A1 * | 3/2005 | Visser et al. | 704/201 |
| 2006/0012426 A1 | 1/2006 | Nezami | |
| 2008/0144709 A1 * | 6/2008 | McCallister et al. | 375/233 |
| 2010/0056082 A1 | 3/2010 | Chiu et al. | |
| 2013/0121440 A1 * | 5/2013 | Cai et al. | 375/296 |

FOREIGN PATENT DOCUMENTS

| | | |
|---|---|---|
| EP | 2117115 A1 | 11/2009 |
| EP | 2117115 A1 * | 11/2009 |
| EP | 2136469 A1 | 12/2009 |
| GB | 2337169 A | 5/1998 |

* cited by examiner

MICROWAVE PREDISTORTED SIGNAL GENERATING METHOD AND APPARATUS

This application is a continuation of International Application No. PCT/CN2011/082282, filed on Nov. 16, 2011, which is hereby incorporated by reference in its entirety.

TECHNICAL FIELD

The present invention relates to the field of wireless technologies, and in particular, to a microwave predistorted signal generating method and apparatus.

BACKGROUND

In microwave technologies, data is directly transmitted through space with no need to lay optical fibers, cables, or the like, which has obvious advantages in engineering in cities, remote areas or special regions such as rivers. The microwave technologies are convenient in networking and flexible in use, and take a short time for service activation. With the development of the microwave technologies, the cost of a microwave equipment is gradually reduced, so that the microwave technologies are more and more widely used.

A power amplifier (PA) is a key component in a microwave communication system, and non-linearity is an inherent feature of the power amplifier. A simplest method for reducing an impact of the non-linearity of the power amplifier on the microwave communication system is to reduce input power of the power amplifier, that is, to perform back-off of the input power of the power amplifier. However, this method reduces maximum transmit power of an outdoor unit (ODU) of the microwave communication system, and also reduces power efficiency of the power amplifier. Another more effective method is a predistortion technology. Besides reducing the impact of the non-linearity of the power amplifier, this method may also raise the maximum transmit power of the ODU of the microwave system, and improve the power amplification efficiency of the power amplifier.

In the predistortion technology in the prior art, a signal received by a microwave receiver is fed back to a microwave transmitter for predistortion computation, and a signal feedback apparatus which is complete from a radio frequency to a baseband needs to be added, so the implementation cost is high.

SUMMARY OF THE INVENTION

Embodiments of the present invention provide a microwave predistorted signal generating method and apparatus, which may reduce the cost of microwave predistortion.

An embodiment of the present invention provides a microwave predistorted signal generating method. A microwave receiver receives a first received signal that has undergone analog-to-digital conversion. The microwave receiver performs channel compensation on the first received signal to obtain a second received signal. The microwave receiver estimates a first transmitted signal according to the second received signal. The first transmitted signal is a transmitted signal of a microwave transmitter before digital-to-analog conversion. The microwave receiver performs predistortion coefficient computation according to the second received signal and the first transmitted signal. The microwave receiver uses a first-order coefficient obtained through the predistortion coefficient computation to perform linear distortion compensation on the second received signal that is before the first transmitted signal is estimated. The microwave receiver sends other predistortion coefficients except for the first-order coefficient to the microwave transmitter, so that the microwave transmitter performs non-linearity predistortion on a transmitted signal by using the other predistortion coefficients except for the first-order coefficient.

An embodiment of the present invention provides a microwave predistorted signal generating apparatus. The apparatus is located in a microwave receiver. An analog-to-digital conversion unit is configured to perform analog-to-digital conversion to obtain a first received signal. A channel compensation unit is configured to perform channel compensation on the first received signal, to obtain a second received signal. An estimating unit is configured to estimate a first transmitted signal according to the second received signal. The first transmitted signal is a transmitted signal of a microwave transmitter before digital-to-analog conversion. A predistortion coefficient computing unit is configured to perform predistortion coefficient computation according to the second received signal and the first transmitted signal. A first-order coefficient compensation unit is configured to perform, by using a first-order coefficient obtained through the predistortion coefficient computation, linear distortion compensation on the second received signal that is before the first transmitted signal is estimated. A predistortion coefficient sending unit is configured to send other predistortion coefficients except for the first-order coefficient to the microwave transmitter, so that the microwave transmitter performs non-linearity predistortion on a transmitted signal by using the other predistortion coefficients except for the first-order coefficient.

In the embodiments of the present invention, a microwave receiver receives a first received signal that has undergone analog-to-digital conversion; performs channel compensation on the first received signal, to obtain a second received signal; estimates a first transmitted signal according to the second received signal, where the first transmitted signal is a transmitted signal of a microwave transmitter before digital-to-analog conversion; performs predistortion coefficient computation according to the second received signal and the first transmitted signal; performs, by using a first-order coefficient obtained through the predistortion coefficient computation, linear distortion compensation on the second received signal that is before the first transmitted signal is estimated; and sends other predistortion coefficients except for the first-order coefficient to the microwave transmitter, so that the microwave transmitter performs non-linearity predistortion on a transmitted signal by using the other predistortion coefficients except for the first-order coefficient. The first received signal is a signal that has undergone analog-to-digital conversion, that is to say, a receiving channel of the microwave receiver may be used to receive the first received signal without requiring the microwave receiver to add an extra channel, so the cost may be significantly reduced. The microwave receiver pre-estimates a transmitted signal and computes predistortion coefficients, and only needs to send predistortion coefficients to the microwave transmitter without requiring the microwave transmitter to perform the predistortion coefficient computation, thereby improving predistortion efficiency.

BRIEF DESCRIPTION OF THE DRAWINGS

To illustrate the technical solutions in the embodiments of the present invention more clearly, the following briefly introduces accompanying drawings required for describing the embodiments. Apparently, the accompanying drawings in the following description show merely some embodiments of the present invention, and a person of ordinary skill in the art may still derive other drawings according to these accompanying drawings without creative efforts.

DETAILED DESCRIPTION OF ILLUSTRATIVE EMBODIMENTS

Specific implementation manners of the present invention are illustrated in the following with reference to the accompanying drawings.

Figure 1:
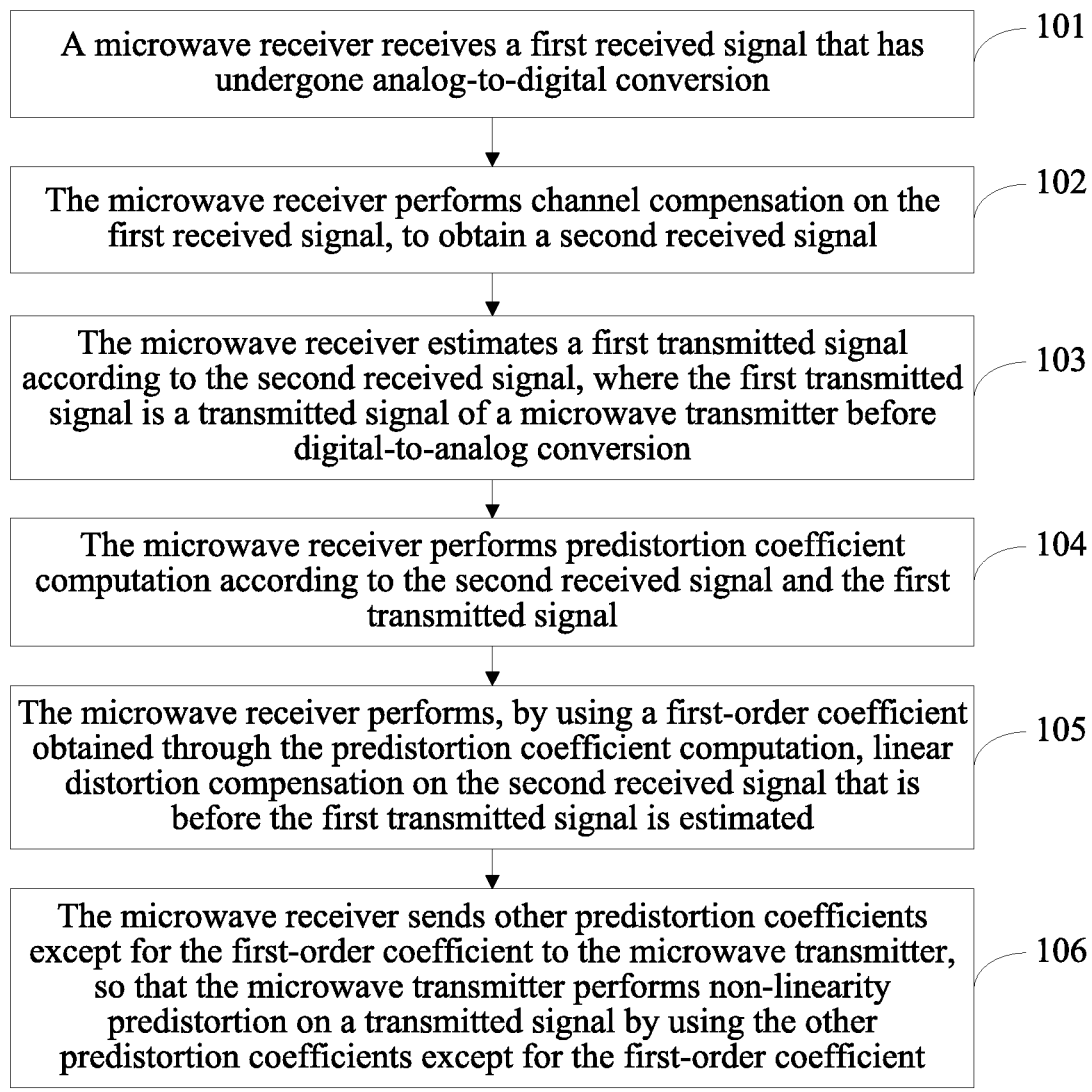
FIG. 1 is a schematic flow chart of a microwave predistorted signal generating method according to an embodiment of the present invention.

FIG. 1 is a schematic flow chart of a microwave predistorted signal generating method according to an embodiment of the present invention.

S101: A microwave receiver receives a first received signal that has undergone analog-to-digital conversion.

S102: The microwave receiver performs channel compensation on the first received signal, to obtain a second received signal.

S103: The microwave receiver estimates a first transmitted signal according to the second received signal, where the first transmitted signal is a transmitted signal of a microwave transmitter before digital-to-analog conversion.

S104: The microwave receiver performs predistortion coefficient computation according to the second received signal and the first transmitted signal.

S105: The microwave receiver performs, by using a first-order coefficient obtained through the predistortion coefficient computation, linear distortion compensation on the second received signal that is before the first transmitted signal is estimated.

S106: The microwave receiver sends other predistortion coefficients except for the first-order coefficient to the microwave transmitter, so that the microwave transmitter performs non-linearity predistortion on a transmitted signal by using the other predistortion coefficients except for the first-order coefficient.

In the embodiment of the present invention, a microwave receiver receives a first received signal that has undergone analog-to-digital conversion; performs channel compensation on the first received signal, to obtain a second received signal; estimates a first transmitted signal according to the second received signal, where the first transmitted signal is a transmitted signal of a microwave transmitter before digital-to-analog conversion; performs predistortion coefficient computation according to the second received signal and the first transmitted signal; performs, by using a first-order coefficient obtained through the predistortion coefficient computation, linear distortion compensation on the second received signal that is before the first transmitted signal is estimated; and sends other predistortion coefficients except for the first-order coefficient to the microwave transmitter, so that the microwave transmitter performs non-linearity predistortion on a transmitted signal by using the other predistortion coefficients except for the first-order coefficient. The first received signal is a signal that has undergone analog-to-digital conversion, that is to say, a receiving channel of the microwave receiver may be used to receive the first received signal without requiring the microwave receiver to add an extra channel, so the cost may be significantly reduced. The microwave receiver pre-estimates a transmitted signal and computes predistortion coefficients, and only needs to send predistortion coefficients to the microwave transmitter without requiring the microwave transmitter to perform the predistortion coefficient computation, thereby improving predistortion efficiency.

Figure 2:
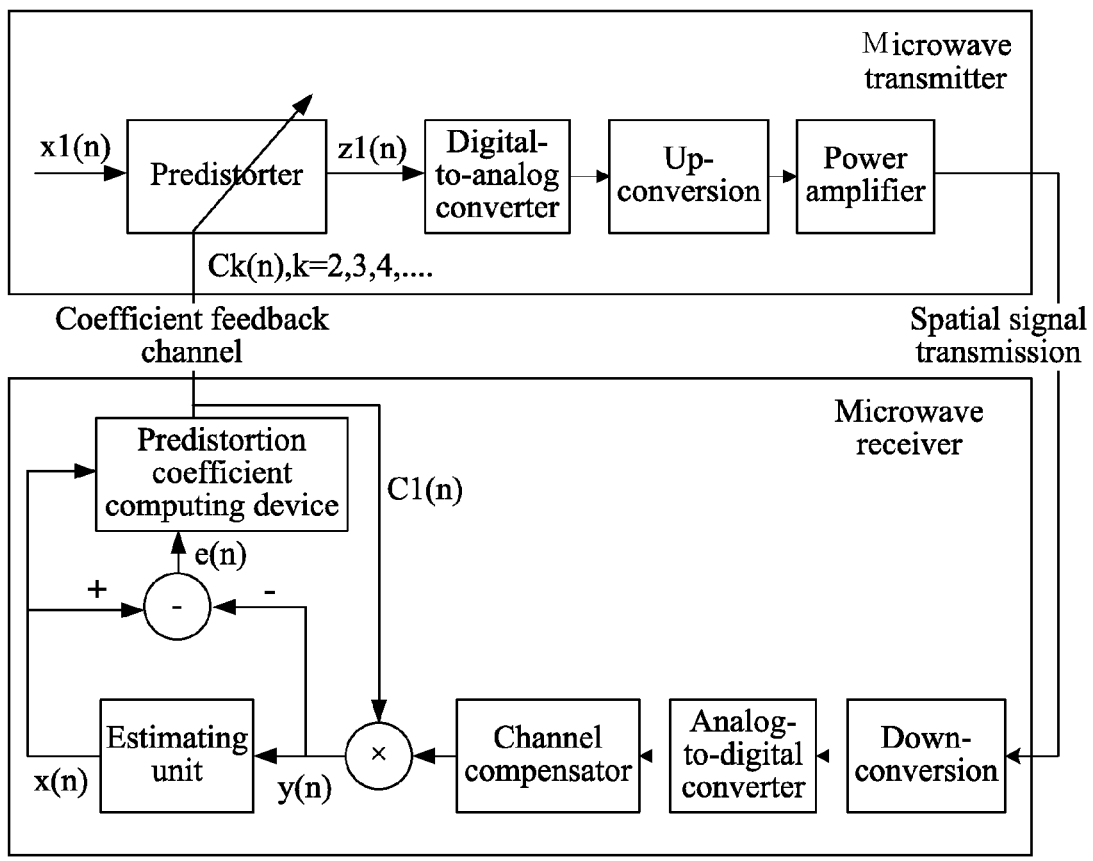
FIG. 2 is a schematic diagram of a microwave system according to an embodiment of the present invention.

FIG. 2 is a schematic diagram of a microwave system according to an embodiment of the present invention. Referring to FIG. 2, the microwave system includes a microwave transmitter and a microwave receiver, where the microwave transmitter transmits a microwave signal, and the microwave receiver receives a microwave signal. Generally, the microwave transmitter also has a microwave receiving function, and the microwave receiver also has a microwave transmitting function. For ease of illustration in the embodiment of the present invention, the microwave transmitter is distinguished from the microwave receiver, and a predistortion method and apparatus of a microwave signal sent by the microwave receiver to the microwave transmitter are similar.

A baseband signal $x_1(n)$ in the microwave transmitter is first processed by a predistorter to form a predistorted signal $z_1(n)$, for example, the predistorter may be a digital baseband predistorter. The signal is converted by a digital-to-analog converter to an analog domain, undergoes up-conversion processing and then arrives at a power amplifier, and is then transmitted to the microwave receiver. The microwave receiver receives the signal from the microwave transmitter, performs down-conversion processing, and obtains a first received signal through an analog-to-digital converter. A channel compensator performs channel compensation on the first received signal, to obtain a second received signal $y(n)$, where the channel compensation may include carrier recovery, channel balancing, I/Q unbalance correction and the like. An estimating unit estimates, according to the second received signal $y(n)$, a first transmitted signal $x(n)$, where the first transmitted signal is a transmitted signal of the microwave transmitter before digital-to-analog conversion, $x(n)$ and $x_1(n)$ are the same signals with different delays, and the estimating unit may be implemented by using a hard decision unit. The signal transmitted by the microwave transmitter is located at an ideal constellation point in a constellation diagram, and the signal received by the microwave receiver deviates from the ideal constellation point in the constellation diagram due to a factor such as non-linearity. The hard decision unit decides the ideal constellation point according to an interval, so as to estimate the first transmitted signal $x(n)$, and a predistortion coefficient computing device performs computation, according to the second received signal $y(n)$ and the first transmitted signal $x(n)$, to obtain predistortion coefficients, where the predistortion coefficients are used to reduce a difference between the second received signal $y(n)$ and the first transmitted signal $x(n)$.

When the channel compensator compensates an impact on a channel, a small amount of linear distortion remains, and the residual linear distortion may be phase distortion and the like, which may cause drift of the predistortion coefficients. After long-time theoretical and experimental researches, the inventor finds that linear distortion compensation may be performed, by using a first-order coefficient in the predistortion coefficients, on the second received signal that is before the first transmitted signal is estimated. In the embodiment of the present invention, the first-order coefficient is fed back to an input end of the estimating unit, thereby implementing residual linear distortion compensation on a signal that is input by the estimating unit, and greatly enhancing stability of a predistortion system.

Other predistortion coefficients except for the first-order coefficient are fed back to the microwave transmitter through a coefficient feedback channel, for example, a microwave overhead channel may be used for implementation. The microwave receiver may send a microwave signal to the microwave transmitter, and the microwave transmitter performs non-linearity predistortion on a transmitted signal by using the other predistortion coefficients except for the first-order coefficient.

During initialization, the predistorter of the microwave transmitter does not work, that is, the other predistortion coefficients except for the first-order coefficient are zero, and the signal $x_1(n)$ is not predistorted and directly arrives at the power amplifier. Because the signal is distorted due to a non-linearity effect of the power amplifier, the microwave receiver uses the first-order coefficient to correct the linear distortion, and sends the other predistortion coefficients except for the first-order coefficient to the microwave transmitter. The predistorter of the microwave transmitter uses these coefficients to perform predistortion, and the predistorted signals may compensate non-linearity of the power amplifier after arriving at the power amplifier. To improve a predistortion effect, the microwave receiver may receive the microwave signal that is after compensation of the non-linearity of the power amplifier, re-compute the predistortion coefficients and send the predistortion coefficients to the microwave transmitter. The predistorter of the microwave transmitter performs predistortion by using these coefficients. The foregoing process is repeatedly performed till the difference between the second received signal $y(n)$ and the first transmitted signal $x(n)$ is lower than a certain threshold or meets a certain requirement, so that the non-linearity of the power amplifier is compensated.

The computation of the predistortion coefficients is related to a predistortion polynomial model of the microwave transmitter, and in the embodiment of the present invention, the microwave transmitter adopts a memoryless polynomial (memoryless polynominal) model to perform predistortion. The formula of the model is:

$$z_1(n)=x_1(n)[C_1(n)+C_2(n)|x_1(n)|+C_3(n)|x_1(n)|^2+\ldots+C_k(n)|x_1(n)|^{k-1}],$$

where $x_1(n)$ is a signal before an $n^{th}$ predistortion, $z_1(n)$ is a signal after the $n^{th}$ predistortion, $C_k(n)$ is a $k^{th}$ order predistortion coefficient at the $n^{th}$ predistortion, k is an integer greater than 0, and n is an integer greater than 0; and in this embodiment, both odd-order and even-order predistortion coefficients are used to perform predistortion.

In the embodiment of the present invention, the microwave transmitter does not receive a first-order predistortion coefficient $C_1(n)$ from the microwave receiver, the microwave transmitter may set $C_1(n)$ to a constant according to a requirement when implementing predistortion, for example, may directly set $C_1(n)$ to 1, and the first-order predistortion coefficient $C_1(n)$ does not contribute to the non-linearity predistortion. The microwave receiver uses the first-order predistortion coefficient $C_1(n)$ obtained through the computation to perform linear distortion compensation on the second received signal that is before the first transmitted signal is estimated, thereby enhancing the stability of the predistortion system.

Definitely, in other embodiments, other polynomial models may be used to perform predistortion on a signal, for example, a Volterra (Volterra) series polynomial model or other simplified models of the Volterra series polynomial model may be used to perform predistortion.

In the embodiment of the present invention, a computing formula of the predistortion coefficients is:

$$C_k(n+1)=C_k(n)+u_k\mathrm{conj}(x(n))|x(n)|^{k-1}((x(n)-y(n))),$$

where $C_k(n+1)$ is a $k^{th}$ order predistortion coefficient at $(n+1)^{th}$ time, $C_k(n)$ is a $k^{th}$ order predistortion coefficient at $n^{th}$ time, $u_k$ is a step for coefficient update, $x(n)$ is the first transmitted signal, $y(n)$ is the second received signal, $\mathrm{conj}(x(n))$ is a conjugate of the first transmitted signal, k is an integer greater than 0, and n is an integer greater than 0. An initial value $C_1(0)$ of the first-order coefficient may be 1+0j, and an initial value $C_k(0)$ of the other predistortion coefficients except for the first-order coefficient may be 0.

Definitely, other computing formulas may also be used for computation, for example, predistortion coefficient computation may be performed according to the second received signal and the first transmitted signal by using a second formula. The second formula is specifically:

$$C_k(n+1)=C_k(n)+\alpha\mathrm{conj}(x(n))|x(n)|^{k-1}((x(n)-y(n))),$$

where $C_k(n+1)$ is a $k^{th}$ order predistortion coefficient at $(n+1)^{th}$ time, $C_k(n)$ is a $k^{th}$ order predistortion coefficient at $n^{th}$ time, a is a step for coefficient update, $x(n)$ is the first transmitted signal, $y(n)$ is the second received signal, $\mathrm{conj}(x(n))$ is a conjugate of the first transmitted signal, k is an integer greater than 0, and n is an integer greater than 0.

In this embodiment, the computing formula of the first-order coefficient is specifically:

$$C_1(n+1)=C_1(n)+u_1\mathrm{conj}(x(n))(x(n)-y(n)),$$

where $C_1(n+1)$ is a first-order coefficient at $(n+1)^{th}$ time, $C_1(n)$ is a first-order predistortion coefficient at $n^{th}$ time, $u_1$ is a step for coefficient update, $x(n)$ is the first transmitted signal, $y(n)$ is the second received signal, $\mathrm{conj}(x(n))$ is a conjugate of the first transmitted signal, and n is an integer greater than 0.

The predistortion coefficients computed in this embodiment may be a first-order coefficient and even-order predistortion coefficients, and may also include odd-order predistortion coefficients, where the even-order predistortion coefficients may only include second-order and fourth-order predistortion coefficients, and the odd-order predistortion coefficients may only include third-order and fifth-order predistortion coefficients.

The predistorter in the present invention may adopt a polynomial model including both odd and even orders, and is located in the microwave transmitter. A coefficient update module of the predistorter is located in the receiver, and coefficients generated by the module are C1, C2, C3, C4, . . . , where the coefficients C2, C3, C4, . . . are fed back to the predistorter of the transmitter through the coefficient feedback channel, thereby implementing coefficient update. Predistortion coefficients in the prior art only include odd-order predistortion coefficients, while in the embodiment of the present invention, even-order predistortion coefficients are also adopted, so that it may be implemented that, in a case that a highest order of the predistortion coefficients is not changed, the predistorter provides more adjustable coefficients, thereby improving a predistortion compensation capability of a new system. For example, a predistorter using coefficients C2, C3, C4 and a predistorter using coefficients C3, C5, C7 have basically equivalent non-linearity compensation capabilities, but the logic of the former only needs to implement $|x(n)|^3$, while the logic of the latter needs to implement $|x(n)|^6$, so that difficulty in logic implementation is significantly reduced.

In the embodiment of the present invention, the first-order coefficient is fed back to the input end of the estimating unit, to implement compensation of the residual linear distortion brought in by the estimating unit, thereby greatly enhancing the stability of the predistortion system; and the other predistortion coefficients except for the first-order coefficient not only include odd-order predistortion coefficients, but also include even-order predistortion coefficients, which may reduce difficulty in logic implementation of the predistorter and lower the system cost.

Figure 3:
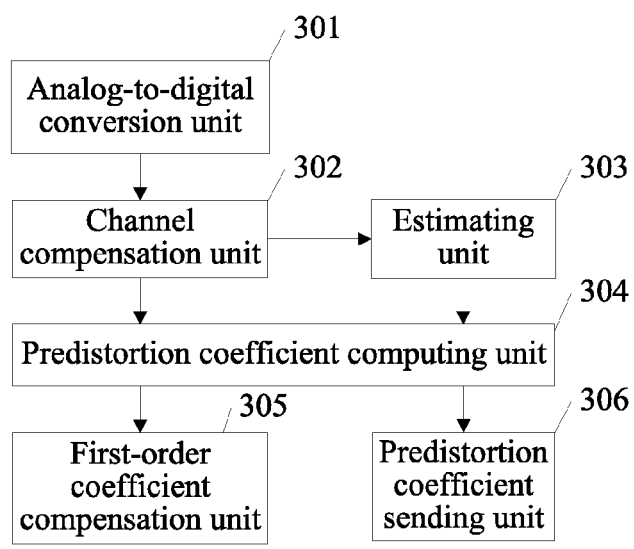
FIG. 3 is a schematic structural diagram of a microwave predistorted signal generating apparatus according to an embodiment of the present invention.

FIG. 3 is a schematic structural diagram of a microwave predistorted signal generating apparatus according to an embodiment of the present invention.

Referring to FIG. 3, the microwave predistorted signal generating apparatus provided by the embodiment of the present invention includes a number of units. An analog-to-digital conversion unit 301 is configured to perform analog-to-digital conversion to obtain a first received signal. A channel compensation unit 302 is configured to perform channel compensation on the first received signal, to obtain a second received signal. An estimating unit 303 is configured to estimate a first transmitted signal according to the second received signal. The first transmitted signal is a transmitted signal of a microwave transmitter before digital-to-analog conversion. A predistortion coefficient computing unit 304, configured to perform predistortion coefficient computation according to the second received signal and the first transmitted signal.

A first-order coefficient compensation unit 305 is configured to perform, by using a first-order coefficient obtained through the predistortion coefficient computation, linear distortion compensation on the second received signal that is before the first transmitted signal is estimated. A predistortion coefficient sending unit 306 is configured to send other predistortion coefficients except for the first-order coefficient to the microwave transmitter, so that the microwave transmitter performs non-linearity predistortion on a transmitted signal by using the other predistortion coefficients except for the first-order coefficient.

The predistortion coefficient computing unit 304 may be specifically configured to perform predistortion coefficient computation according to the second received signal and the first transmitted signal by using a first formula. The first formula is specifically:

$$C_k(n+1)=C_k(n)+u_k\text{conj}(x(n))|x(n)|^{k-1}((x(n)-y(n))),$$

where $C_k(n+1)$ is a $k^{th}$ order predistortion coefficient at $(n+1)^{th}$ time, $C_k(n)$ is a $k^{th}$ order predistortion coefficient at $n^{th}$ time, $u_k$ is a step for coefficient update, $x(n)$ is the first transmitted signal, $y(n)$ is the second received signal, $\text{conj}(x(n))$ is a conjugate of the first transmitted signal, k is an integer greater than 0, and n is an integer greater than 0.

The first formula of the first-order coefficient is specifically:

$$C_1(n+1)=C_1(n)+u_1\text{conj}(x(n))(x(n)-y(n)),$$

where $C_1(n+1)$ is a first-order coefficient at $(n+1)^{th}$ time, $C_1(n)$ is a first-order predistortion coefficient at $n^{th}$ time, $u_1$ is a step for coefficient update, $x(n)$ is the first transmitted signal, $y(n)$ is the second received signal, $\text{conj}(x(n))$ is a conjugate of the first transmitted signal, and n is an integer greater than 0.

The predistortion coefficient computing unit 304 may be specifically configured to compute the first-order coefficient and even-order predistortion coefficients according to the second received signal and the first transmitted signal, and may also be configured to compute odd-order predistortion coefficients according to the second received signal and the first transmitted signal.

The predistortion coefficient computing unit 304 may be specifically configured to compute first-order, second-order and fourth-order predistortion coefficients according to the second received signal and the first transmitted signal, and may also be configured to compute third-order and fifth-order predistortion coefficients.

In the embodiment of the present invention, a microwave receiver receives a first received signal that has undergone analog-to-digital conversion; performs channel compensation on the first received signal, to obtain a second received signal; estimates a first transmitted signal according to the second received signal, where the first transmitted signal is a transmitted signal of a microwave transmitter before digital-to-analog conversion; performs predistortion coefficient computation according to the second received signal and the first transmitted signal; performs, by using a first-order coefficient obtained through the predistortion coefficient computation, linear distortion compensation on the second received signal that is before the first transmitted signal is estimated; and sends other predistortion coefficients except for the first-order coefficient to the microwave transmitter, so that the microwave transmitter performs non-linearity predistortion on a transmitted signal by using the other predistortion coefficients except for the first-order coefficient. The first received signal is a signal that has undergone analog-to-digital conversion, that is to say, a receiving channel of the microwave receiver may be used to receive the first received signal without requiring the microwave receiver to add an extra channel, so the cost may be significantly reduced. The microwave receiver pre-estimates a transmitted signal and computes predistortion coefficients, and only needs to send predistortion coefficients to the microwave transmitter without requiring the microwave transmitter to perform the predistortion coefficient computation, thereby improving predistortion efficiency.

Through the foregoing description of the implementation manners, a person skilled in the art may clearly know that the embodiments of the present invention may be implemented in a manner of software plus a necessary universal hardware platform, and definitely, may also be implemented through hardware. Based on such understanding, the technical solutions of the embodiments of the present invention or the part that makes contributions to the prior art may be substantially embodied in a form of a software product. The computer software product is stored in a storage medium, and includes several instructions to instruct a computer equipment (which may be a personal computer, a server, a network equipment or the like) to execute the method described in the embodiments of the present invention.

The foregoing description is merely preferred embodiments of the present invention, but is not intended to limit the scope of the claims of the present invention. Therefore, any equivalent variation made according to the claims of the present invention shall fall within the scope of the present invention.

What is claimed is:

1. A microwave predistorted signal generating method, comprising:
   receiving, by a microwave receiver, a first received signal that has undergone analog-to-digital conversion;
   performing, by the microwave receiver, channel compensation on the first received signal, to obtain a second received signal;
   estimating, by the microwave receiver, a first transmitted signal according to the second received signal, wherein the first transmitted signal is a transmitted signal of a microwave transmitter before digital-to-analog conversion;

performing, by the microwave receiver, predistortion coefficient computation according to the second received signal and the first transmitted signal;

performing, by the microwave receiver by using a first-order coefficient obtained through the predistortion coefficient computation, linear distortion compensation on the second received signal that is before the first transmitted signal is estimated;

sending, by the microwave receiver, other predistortion coefficients except for the first-order coefficient to the microwave transmitter, so that the microwave transmitter performs non-linearity predistortion on a transmitted signal by using the other predistortion coefficients except for the first-order coefficient;

wherein performing the predistortion coefficient computation according to the second received signal and the first transmitted signal specifically comprises:

performing, by the microwave receiver, predistortion coefficient computation according to the second received signal and the first transmitted signal by using a first formula, wherein the first formula comprises:

$$C_k(n+1) = C_k(n) + u_k \text{conj}(x(n))|x(n)|^{k-1}((x(n)-y(n)),$$

where $C_k(n+1)$ is a $k^{th}$ order predistortion coefficient at $(n+1)^{th}$ time, $C_k(n)$ is a $k^{th}$ order predistortion coefficient at $n^{th}$ time, $u_k$ is a step for coefficient update, $x(n)$ is the first transmitted signal, $y(n)$ is the second received signal, $\text{conj}(x(n))$ is a conjugate of the first transmitted signal, k is an integer greater than 0, and n is an integer greater than 0; and wherein an initial value $C_k(0)$ of the other predistortion coefficients except for the first-order coefficient is 0.

2. The method according to claim 1, wherein the computing formula of the first-order coefficient comprises:

$$C_1(n+1) = C_1(n) + u_1 \text{conj}(x(n))(x(n)-y(n)),$$

where $C_1(n+1)$ is a first-order coefficient at $(n+1)^{th}$ time, $C_1(n)$ is a first-order predistortion coefficient at $n^{th}$ time, $u_1$ is a step for coefficient update, $x(n)$ is the first transmitted signal, $y(n)$ is the second received signal, $\text{conj}(x(n))$ is a conjugate of the first transmitted signal, and n is an integer greater than 0.

3. The method according to claim 2, wherein an initial value $C_1(0)$ of the first-order coefficient is 1+0j.

4. The method according to claim 1, wherein performing predistortion coefficient computation according to the second received signal and the first transmitted signal comprises:

computing, by the microwave receiver, the first-order coefficient according to the second received signal and the first transmitted signal; and computing, by the microwave receiver, even-order predistortion coefficients according to the second received signal and the first transmitted signal.

5. The method according to claim 4, wherein performing predistortion coefficient computation according to the second received signal and the first transmitted signal further comprises:

computing, by the microwave receiver, odd-order predistortion coefficients according to the second received signal and the first transmitted signal.

6. The method according to claim 5, wherein computing odd-order predistortion coefficients according to the second received signal and the first transmitted signal comprises:

computing, by the microwave receiver, third-order and fifth-order predistortion coefficients according to the second received signal and the first transmitted signal.

7. The method according to claim 4, wherein computing the even-order predistortion coefficients according to the second received signal and the first transmitted signal specifically comprises:

computing, by the microwave receiver, second-order and fourth-order predistortion coefficients according to the second received signal and the first transmitted signal.

8. An apparatus located in a microwave receiver, the apparatus comprising:

an analog-to-digital conversion unit, configured to perform analog-to-digital conversion to obtain a first received signal;

a channel compensation unit, configured to perform channel compensation on the first received signal, to obtain a second received signal;

an estimating unit, configured to estimate a first transmitted signal according to the second received signal, wherein the first transmitted signal is a transmitted signal of a microwave transmitter before digital-to-analog conversion;

a predistortion coefficient computing unit, configured to perform predistortion coefficient computation according to the second received signal and the first transmitted signal;

a first-order coefficient compensation unit, configured to perform, by using a first-order coefficient obtained through the predistortion coefficient computation, linear distortion compensation on the second received signal that is before the first transmitted signal is estimated; and a predistortion coefficient sending unit, configured to send other predistortion coefficients except for the first-order coefficient to the microwave transmitter, so that the microwave transmitter performs non-linearity predistortion on a transmitted signal by using the other predistortion coefficients except for the first-order coefficient; and wherein the predistortion coefficient computing unit is configured to perform predistortion coefficient computation according to the second received signal and the first transmitted signal by using a first formula, wherein the first formula comprises:

$$C_k(n+1) = C_k(n) + u_k \text{conj}(x(n))|x(n)|^{k-1}((x(n)-y(n)),$$

where $C_k(n+1)$ is a $k^{th}$ order predistortion coefficient at $(n+1)^{th}$ time, $C_k(n)$ is a $k^{th}$ order predistortion coefficient at $n^{th}$ time, $u_k$ is a step for coefficient update, $x(n)$ is the first transmitted signal, $y(n)$ is the second received signal, $\text{conj}(x(n))$ is a conjugate of the first transmitted signal, k is an integer greater than 0, and n is an integer greater than 0, wherein an initial value $C_k(0)$ of the other predistortion coefficients except for the first-order coefficient is 0.

9. The apparatus according to claim 8, wherein the first formula of the first-order coefficient comprises:

$$C_1(n+1) = C_1(n) + u_1 \text{conj}(x(n))(x(n)-y(n)),$$

where $C_1(n+1)$ is a first-order coefficient at $(n+1)^{th}$ time, $C_1(n)$ is a first-order predistortion coefficient at $n^{th}$ time, $u_1$ is a step for coefficient update, $x(n)$ is the first transmitted signal, $y(n)$ is the second received signal, $\text{conj}(x(n))$ is a conjugate of the first transmitted signal, and n is an integer greater than 0.

10. The apparatus according to claim 8, wherein the predistortion coefficient computing unit is specifically configured to compute the first-order coefficient and even-order predistortion coefficients according to the second received signal and the first transmitted signal.

11. The apparatus according to claim 10, wherein the predistortion coefficient computing unit is further configured to compute odd-order predistortion coefficients according to the second received signal and the first transmitted signal.

12. The apparatus according to claim 10, wherein the predistortion coefficient computing unit is specifically configured to compute first-order, second-order and fourth-order predistortion coefficients according to the second received signal and the first transmitted signal.

* * * * *